(12) United States Patent
Brauer et al.

(10) Patent No.: US 8,564,359 B2
(45) Date of Patent: Oct. 22, 2013

(54) METHOD AND SYSTEM FOR CONTROLLING HS-NMOS POWER SWITCHES WITH SLEW-RATE LIMITATION

(75) Inventors: Michael Brauer, Kirchheim/Teck-Nabern (DE); Stephan Drebinger, Kirchheim/Teck-Nabern (DE)

(73) Assignee: Dialog Semiconductor GmbH., Kirchheim/Teck-Nabern (DE)

( * ) Notice: Subject to any disclaimer, the term of this patent is extended or adjusted under 35 U.S.C. 154(b) by 28 days.

(21) Appl. No.: 12/807,769

(22) Filed: Sep. 14, 2010

(65) Prior Publication Data
US 2012/0056655 A1 Mar. 8, 2012

(30) Foreign Application Priority Data
Sep. 7, 2010 (EP) ..................................... 10175672

(51) Int. Cl.
*H03K 17/687* (2006.01)
(52) U.S. Cl.
USPC ............................. 327/427; 327/433; 327/437
(58) Field of Classification Search
USPC .................................................. 327/365–508
See application file for complete search history.

(56) References Cited

U.S. PATENT DOCUMENTS

| | | | | |
|---|---|---|---|---|
| 5,194,760 A * | 3/1993 | Braun et al. | ................... | 327/110 |
| 5,404,053 A * | 4/1995 | Poma et al. | .................... | 327/108 |
| 5,469,094 A * | 11/1995 | Nessi | ............................ | 327/110 |
| 5,656,969 A * | 8/1997 | Pulvirenti et al. | ............ | 327/561 |
| 6,137,329 A * | 10/2000 | Kardash | ......................... | 327/170 |
| 6,559,689 B1 * | 5/2003 | Clark | ............................... | 327/97 |
| 6,590,439 B1 * | 7/2003 | Larson | .......................... | 327/363 |
| 6,781,422 B1 | 8/2004 | Yang | | |
| 6,836,173 B1 | 12/2004 | Yang | | |
| 6,975,146 B1 | 12/2005 | Schottler | | |
| 7,365,585 B2 * | 4/2008 | Fort et al. | ...................... | 327/170 |
| 7,408,398 B2 * | 8/2008 | Sander | ........................... | 327/427 |
| 8,194,379 B2 * | 6/2012 | Herr et al. | ..................... | 361/93.9 |
| 2003/0151447 A1 | 8/2003 | Moriconi et al. | | |
| 2006/0033551 A1 * | 2/2006 | Dong et al. | .................... | 327/427 |

FOREIGN PATENT DOCUMENTS

EP   0 574 646   12/1993

OTHER PUBLICATIONS

European Search Report 10175672.4-1233, Oct. 6, 2010, Dialog SEmiconductor GmbH.
European Search Report 10 175 672.4-1233 Mail date- May 15, 2012, Dialog Semiconductor GmbH.

* cited by examiner

*Primary Examiner* — Lincoln Donovan
*Assistant Examiner* — Brandon S Cole
(74) *Attorney, Agent, or Firm* — Saile Ackerman LLC; Stephen B. Ackerman

(57) ABSTRACT

A method and system for limiting the slew rate of the output voltage of one or more high side (HS) NMOS power switches is disclosed. A circuit arrangement configured to control a first NMOS switch is described. The arrangement comprises voltage provisioning means configured to supply a gate voltage to a gate terminal of the first NMOS switch; current provisioning means configured to provide a current; a first control stage configured to provide and/or remove a connection between the gate terminal of the first NMOS switch and the voltage provisioning means, thereby switching the first NMOS switch to an on-state and/or an off-state, respectively; and a first feedback control link between an output terminal of the first NMOS switch and the current provisioning means configured to control the slew-rate of a voltage at the first output terminal.

20 Claims, 5 Drawing Sheets

METHOD AND SYSTEM FOR CONTROLLING HS-NMOS POWER SWITCHES WITH SLEW-RATE LIMITATION

BACKGROUND (1) Field

This relates generally to NMOS switches and relates more specifically to a method and system for limiting the slew rate of the output voltage of one or more high side (HS) NMOS power switches.

(2) Description of the Related Art

High-side NMOS switches are seen to be preferable to PMOS switches in several respects. Typically, NMOS switches have an $R_{DSon}$, i.e. a drain to source resistance in on-state, which is about a factor of two times lower than the drain to source resistance of PMOS switches. Furthermore, the parasitic body diodes of NMOS switches are both pointing to the substrate or to a freely available bulk node in case of an isolated device, which tends to ease system design.

On the other hand, the use of NMOS transistors as a high-side switch also has drawbacks. When using enhancement type NMOS transistors that are available on standard CMOS processes, the gate terminal of the transistor has to be biased positive with respect to its source terminal, in order to drive the transistor in strong inversion. Consequently, if the transistor is connected as a high-side switch, the gate node typically must be driven above the positive voltage rail, i.e. the gate node typically must have a higher potential than the source terminal that is connected to the positive voltage rail. Therefore, it is usually required to provide a charge pump in order to supply the gate bias. In view of the costs and design constraints involved when using charge pumps, it is desirable to limit the number of required charge pumps. In particular, it is desirable to reduce the number of charge pumps, which are required for an array, or a plurality of NMOS switches. In order to avoid the requirement of charge pumps altogether, it is current practice to use PMOS switches, even though they exhibit the above-mentioned shortcomings.

A further aspect to consider is the control of the inrush current of a switch, which is being switched to on-state. Current practice for inrush current control using PMOS switches is e.g. a two-phase approach using two switches connected in parallel. In an initial phase, a first switch having a relatively high $R_{DSon}$ is closed or activated. Its relatively high resistive drop ensures a relatively slow rise time of the current and therefore limits the inrush current. After a certain time the main switch, i.e. a second switch being parallel to the first switch and having a relatively low $R_{DSon}$, is closed or activated. This two-phase approach has the effect that during the first phase of the turn-on, the overall switch comprising the two parallel switches has a high $R_{DSon}$. High resistive load conditions on the output of the overall switch could therefore lead to a situation, where the output voltage does not rise until the second phase of the turn-on, i.e. until the resistive $R_{DSon}$ value of the overall switch is reduced. In such a case the turn-on upon closing of the second switch will be relatively steep during the second phase, causing a high inrush current, despite the two-phase approach.

In view of the multiple advantages of enhancement type NMOS switches, it is a challenge for engineers to design methods and circuit arrangements for controlling the slew rate of one or more enhancement type NMOS switches while reducing the number of required charge pumps. In other words, to design a driver for a NMOS switch or an array of NMOS switches that controls the slew rate and which requires a reduced number of charge pumps. Furthermore, it may be beneficial to reduce the current, which is drawn from the charge pump(s) during steady state operation of the one or more NMOS switches.

SUMMARY

A principal object of the present invention is to achieve method and circuit arrangements for a driver reducing the slew rate of one or more enhancement type NMOS power switches.

A further object of the invention is to reduce the number of charge pumps required for the operation of the NMOS power switches.

A further object of the present invention is to reduce the current, which is drawn from one or more charge pumps during steady state operation of the one or more NMOS switches.

In accordance with the objects of this invention circuit arrangements for a driver reducing the slew rate of one or more enhancement type NMOS power switches have been achieved. These circuit arrangements comprise, firstly, voltage provisioning means configured to supply a gate voltage to a gate terminal of the first NMOS switch, and current provisioning means configured to provide a current. Furthermore the circuit arrangement comprise a first control stage configured to provide and/or remove a connection between the gate terminal of the first NMOS switch and the voltage provisioning means, thereby switching the first NMOS switch to an on-state and/or an off-state, respectively, and a first feedback control link between an output terminal of the first NMOS switch and the current provisioning means configured to control the slew-rate of a voltage at the output terminal. In accordance with the objects of this invention a method for controlling an array of power switches with slew-rate limit has been disclosed. The method comprises, firstly, the following steps: (1) providing an array of HS-NMOS power switches comprising a multitude of switch driver cells, a charge pump, and (2) limiting slew rate of the power switch. Furthermore the method comprises the steps of (3) deploying only one charge pump for the total array of power switches, wherein the charge pump is isolated from the multitude of switch drivers, and (4) establishing zero current draw from the charge pump in case of a steady state of a power switch.

According to an aspect, a circuit arrangement or driver circuit configured to control a first NMOS switch is described. The first NMOS switch may be a high side NMOS power switch, comprising a gate terminal, a drain terminal at an input side, and a source terminal at an output side. The arrangement may comprise voltage-provisioning means configured to supply a gate voltage to the gate terminal of the first NMOS switch. The voltage provisioning means may be implemented as a charge pump or as any means to supply a positive boost supply voltage $V_{DD}$ of the circuit arrangement, e.g. a boost supply circuitry such as a capacitive or inductive boost converter. Thus, a high voltage, higher than the positive voltage rail, may be provided to drive the NMOS gate.

The circuit arrangement may comprise current provisioning means configured to provide a current. In an embodiment, the current provided by the current provisioning means is constant and/or fixed. The current provided by the current provisioning means may be used to control the slew rate of the output voltage at the output terminal of the first NMOS switch as is explained below. The current provisioning means and the voltage provisioning means may be implemented in a joint component or subassembly. In particular, the voltage provisioning means and the current provisioning means may be implemented as a single common charge pump.

The circuit arrangement may comprise a first control stage configured to provide and/or remove a connection between the gate terminal of the first NMOS switch and the voltage provisioning means, thereby switching the first NMOS switch to an on state and/or an off-state, respectively. The first control stage may be implemented e.g. as a push-pull stage. The push-pull stage may comprise a pull transistor configured to couple the gate terminal of the first NMOS switch to the voltage provisioning means when the pull transistor is on. Alternatively or in addition, the push-pull stage may comprise a push transistor configured to couple the gate terminal of the first NMOS switch to a low voltage point when the push transistor is on. The first control stage may itself be controlled by a logical control signal, e.g. a binary signal, wherein the control signal causes the first control stage to provide and/or remove the connection between the gate terminal of the first NMOS switch and the voltage provisioning means. In particular, the control signal may cause the pull transistor to be switched on, while the push transistor is switched off, or vice versa. Further logic control elements may be provided to generate and/or process the control signal.

The circuit arrangement may further comprise a first regulation loop comprising a first feedback control link between the output terminal of the first NMOS switch, i.e. the source terminal of the first NMOS switch, and the current provisioning means. The input of the first feedback control link may be coupled to the output terminal of the first NMOS switch, whereas the output of the first feedback control link may be coupled to the current provisioning means. The first regulation loop and/or the first feedback control link may be configured to control the slew-rate of a voltage at the output terminal of the first NMOS switch. In other words, by means of the first regulation loop and/or the first feedback control link the current provided by the current provisioning means may be used to control the slew-rate of the voltage at the output terminal of the first NMOS switch. The first feedback control link may be connected to the current provisioning means, thereby closing the control loop, and the current at the output of the first feedback control link may be equal to the current provided by the current provisioning means, in particular, if the current provisioning means are directly coupled to the output of the first feedback control link. As such, the first regulation loop may be a closed feedback control loop that is connected to the gate terminal of the first NMOS switch—either directly or via a transistor—and controls the slew-rate of the voltage at the output terminal of the first NMOS switch.

It should be noted that the current of the current provisioning means may be provided to the first regulation loop via current amplification means configured to map the current provided by the current provisioning means to the first regulation loop. In other words, the current amplification means may amplify the current provided by the current provisioning means, thereby providing an amplified current. By coupling the output of the current amplification means to the first feedback control link, the amplified current may be provided to the first regulation loop, so as to control the slew rate of the output voltage of the first NMOS switch. The current amplification means may be implemented as a current mirror, wherein the current mirror may comprise a first and a second transistor. In an embodiment, the current provisioning means may be implemented as a constant current source. In this case, the amplified constant current is coupled to the first feedback control link and controls the slew rate of the output voltage of the first NMOS switch.

In an embodiment, the voltage provisioning means and the current provisioning means are implemented as a single component, e.g. as a charge pump. In this case, the charge pump voltage is used for the voltage provisioning means and the short circuit current of the charge pump is used for the current provisioning means. Furthermore, the charge pump output terminal is coupled as voltage provisioning means to the gate terminal of the first NMOS switch. In such a case, the first feedback control link is coupled to the charge pump output terminal, acting as current provisioning means, and to the gate terminal of the first NMOS switch.

By using the above circuit arrangement, the current provisioning means may be used to control the current passing through the first regulation loop, in particular through the first feedback control link, and the first regulation loop may be used to control the slew-rate of the output voltage of the first NMOS switch. For this purpose, the first regulation loop may comprise a first capacitor C1. The first capacitor C1 may be connected in parallel to the load that is driven by the first NMOS switch. Furthermore, the first feedback control link of the first regulation loop may comprise first feedback amplification means configured to map/amplify a current through the first capacitor C1 at an input of the first feedback control link (or at the input of the first feedback amplification means) to a current at an output of the first feedback control link (or at the output of the first feedback amplification means) coupled to the current provisioning means. In other words, the current passing through the first capacitor C1 may be amplified using first feedback amplification means. By doing this, the capacitor value of the first capacitor may be reduced.

As indicated above, the output of the first feedback control link may be coupled to the current provisioning means via current amplification means. Consequently, when closing the control loop, the current at the output of the first feedback amplification means, i.e. the current at the output of the first feedback control link, is typically proportional to the current provided by the current provisioning means. The proportionality factor typically is the gain value of the current amplification means. If the output of the first feedback control link is directly coupled to the current provisioning means, the current at the output of the first feedback control link is equal to the current provided by the current provisioning means.

At the same time, the current at the input of the first feedback control link corresponds to the current through the first capacitor C1, i.e. $I_{C1}$. The current through the first capacitor in turn relates to the slew rate of the voltage at the first capacitor, i.e. of the output voltage of the first NMOS switch, via the capacitor value C1. Consequently, the slew rate of the output voltage of the first NMOS switch may be expressed by $$\frac{dV_{OUT}}{dt} = \frac{I_{C1}}{C1}.$$

In view of the fact that the current $I_{C1}$ at the input of the first feedback control link is proportional to the current provided by the current provisioning means (via the gain value of the first feedback amplification means), the slew rate of the output voltage of the first NMOS switch may be expressed by $$\frac{dV_{OUT}}{dt} = \frac{I_{C1}}{C1} = \frac{I_{CP}}{k_1 C1},$$

wherein $I_{CP}$ is the current provided by the current provisioning means and $k_1$ is the gain value of the first feedback amplification means, i.e. the gain applied to the current through the first capacitor $I_{C1}$. It should be noted that if the circuit arrangement comprises optional current amplification means, $I_{CP}$ should be replaced by the amplified current in the above formula. As such, the slew rate of the output voltage may be controlled by the current provided by the current provisioning means and possibly the current gain of the optional current amplification means. This is achieved by providing a first feedback control link between the output terminal of the first NMOS switch and the current provisioning means.

In an embodiment, the first feedback amplification means is a first current mirror, wherein the first current mirror may comprise an input transistor N3, and an output transistor N2. In this case, the gain value of the feedback amplification means is $$k_1 = \frac{W_{N2}}{L_{N2}} \frac{L_{N3}}{W_{N3}},$$

wherein $$\frac{W_{N2}}{L_{N2}}$$

is a width to length ratio of the output transistor N2 and $$\frac{W_{N3}}{L_{N3}}$$

is a width to length ratio of the input transistor N3.

The circuit arrangement may further comprise current biasing means configured to provide bias currents to the input transistor N3 and the output transistor N2 of the first current mirror. The current biasing means may comprise first bias amplification means to map the current of a biasing current source to the input transistor N3 of the first current mirror. In other words, the current of the biasing current source may be amplified by the first bias amplification means and the amplified current may be provided to the input transistor N3, e.g. the drain terminal of the input transistor N3. Furthermore, the current biasing means may comprise second bias amplification means to map the current of the biasing current source to the output transistor N2 of the first current mirror. In other words, the current of the biasing current source may be amplified by the second bias amplification means and the amplified current may be provided to the output transistor N2, e.g. the drain terminal of the output transistor N2. The first and second bias amplification means may be implemented as current mirrors. These current mirrors may have a joint transistor coupled to the biasing current source and separate transistors coupled to the input transistor N3 and the output transistor N2, respectively. In an embodiment, the ratio of the current provided by the second bias amplification means and the current provided by the first bias amplification means corresponds to the gain value $k_1$ of the first current mirror, so as to match the ratio of the current at the input transistor N3 and the current at the output transistor N2 of the current mirror.

The current biasing means may be used to maintain the first regulation loop and/or the first feedback control link in active state, even at low output voltages. Typically, this is achieved by providing a biasing drain to source current through the input transistor N3 and the output transistor N2 of the first current mirror, and to thereby maintain a closed connection between the capacitor C1 and the current provisioning means, even at low output voltages at the output terminal of the first NMOS switch. As a consequence, discontinuities in the regulation of the output voltage of the NMOS switch during activation of the NMOS switch may be reduced or avoided.

The circuit arrangement may comprise a source follower, which may be implemented as a PMOS transistor. An output terminal of the source follower, i.e. the source terminal of a PMOS transistor, may be connected or coupled to a common gate terminal of the input transistor N3 and the output transistor N2 of the first current mirror. The circuit arrangement may further comprise a current source for the source follower. Furthermore, the circuit arrangement may comprise follower amplification means configured to amplify a current provided by the current source for supply to the source follower. The follower amplification means may be implemented as a current mirror. The (amplified) current may be provided to the source terminal of the source follower. If the source follower is implemented as a PMOS transistor, the provided current leads to a source to drain current through the source follower. By coupling the gate terminal of the PMOS transistor to the drain terminal of the input transistor N3 and by coupling the drain terminal of the PMOS transistor to the source terminal of the input transistor N3, the drain to source voltage of the input transistor N3 can be controlled. As a result, the source follower may be used to reduce the effective threshold voltage of the first current mirror, thereby improving the performance of the first regulation loop at low output voltages.

The circuit arrangement may further comprise a comparing portion configured to monitor the voltage at the gate terminal of the first NMOS switch and further configured to detect that the voltage at the gate terminal of the first NMOS switch exceeds a voltage threshold value. For this purpose, the comparing portion may comprise one or more transistors and/or a current sink.

The circuit arrangement may further comprise a mode switching portion configured to disconnect the current provisioning means from the first regulation loop and/or the first feedback control link, if it is determined that the voltage at the gate terminal of the first NMOS switch exceeds the voltage threshold value. The mode switching portion may further be configured to provide a connection between the gate terminal of the first NMOS switch and the voltage provisioning means, if it is determined that the voltage at the gate terminal of the first NMOS switch exceeds the voltage threshold value. The mode switching portion may comprise a transistor P4 configured to provide the connection between the gate terminal of the first NMOS switch and the voltage provisioning means, so as to keep the first NMOS switch in on-state. In addition, the mode switching portion may comprises logical components such as a Schmitt trigger, a D-Flip-Flop and/or an AND gate. The logical components may be used to prevent oscillations between the different modes, e.g. the slew-rate limitation mode and the full voltage mode, of the circuit arrangements. Furthermore, the logical components may be used to latch one of the different modes of the circuit arrangement.

The comparing portion and/or the mode switching portion may be used to switch the arrangement from a slew-rate limitation mode to a full voltage mode, thereby ensuring a slew-rate limitation of the output voltage of the first NMOS switch during activation and a zero current draw from the voltage provisioning means, e.g. the charge pump, during steady on-state of the first NMOS switch. This reduces power consumption during steady on-state.

The circuit arrangement may be configured to control a second NMOS switch. In such a case, the arrangement may comprise a second control stage configured to provide and/or remove a connection between a gate terminal of the second NMOS switch and the voltage provisioning means, thereby switching the second NMOS switch to an on-state and/or an off-state, respectively. In addition, the arrangement may comprise a second regulation loop comprising a second feedback control link between an output terminal of the second NMOS switch and the current provisioning means, configured to control the slew-rate of a voltage at the output terminal of the second NMOS switch. Typically, the voltage provisioning means and the current provisioning means may be used for controlling the first and the second NMOS switch. The current of the current provisioning means may be mapped to the second regulation loop and/or the second feedback control link via second current amplification means, e.g. via a second current mirror. In other words, the current provisioning means may be coupled to the second feedback control link, e.g. via second current amplification means.

It should be noted that in general, the circuit arrangement might be extended to control an arbitrary number M of NMOS switches. In such a case, the circuit arrangement may comprise voltage provisioning means, e.g. a single charge pump, and a plurality of current provisioning means. The plurality of current provisioning means may be implemented e.g. as a single current source and a plurality of current amplification means. Furthermore, the circuit arrangement may comprise a plurality of M control stages configured to couple and/or de-couple the gate terminals of the plurality of NMOS switches to the voltage provisioning means. In addition, the circuit arrangement may comprise a plurality of M regulation loops, each regulation loop including a feedback control link coupling an output terminal of a NMOS switch of the plurality of NMOS switches to a respective one of the plurality of current provisioning means. Optionally, the circuit arrangement could comprise any one of: a plurality of comparing portions, a plurality of mode switching portions, a plurality of current biasing means and a plurality of source followers.

In a preferred embodiment, the different components of the circuit arrangement are implemented using CMOS technology. In particular, the different amplification means, the control stage, the comparing portion, the mode-switching portion, and the source follower may be implemented using NMOS and/or PMOS transistors.

The circuit arrangement described in the present document may be applied to any kind of high-side NMOS switch, which requires a controlled on/off characteristic. Applications can be found in all areas of power electronic like in the handheld—, automotive—and the industrial field.

The methods and systems/arrangements including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

BRIEF DESCRIPTION OF THE DRAWINGS

In the accompanying drawings forming a material part of this description, there is shown.

DESCRIPTION OF THE PREFERRED EMBODIMENTS

Figure 1A:
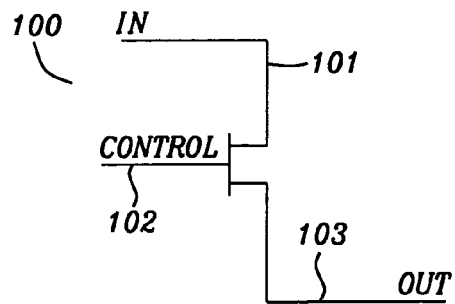
FIG. 1a illustrates an example NMOS switch.

FIG. 1a illustrates an example enhancement type NMOS switch 100. In particular, the drain terminal 101, which is the input terminal and the source terminal 103, which is the output terminal of the high-side NMOS switch 100, is shown. Furthermore, FIG. 1a shows the gate terminal 102 of the NMOS switch 100, which is the control terminal. It is desirable to provide a circuit arrangement, which is configured to control one or more of such enhancement type NMOS switches 100. In particular, it is desirable to provide a circuit arrangement, which is configured to control the slew rate of the voltage at the output terminal 103 of the one or more NMOS switches 100.

Figure 1B:
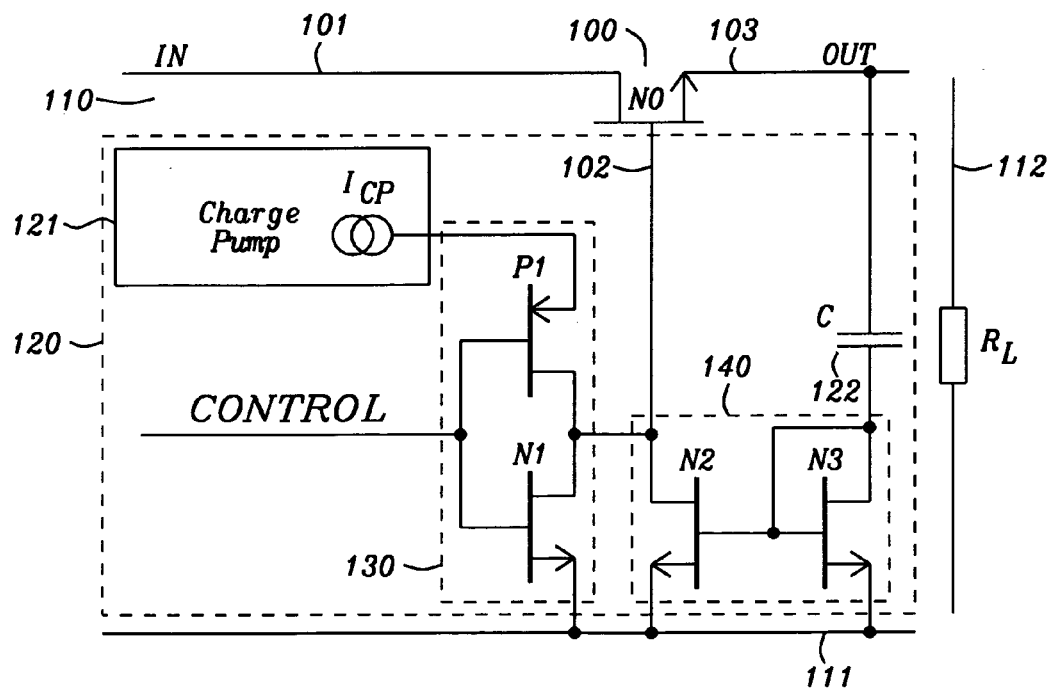
FIG. 1b illustrates an example slew-rate limited switch driver.

FIG. 1b illustrates an example slew-rate limited switch driver or driver cell 110. The NMOS switch N0 (reference numeral 100) that is to be controlled or driven is shown at the top of FIG. 1b. Driving the switch 100, such that its output voltage waveform, i.e. the voltage between the output terminal 103 and the negative voltage rail 111, follows a linear ramp during a switch turn-on period has the advantage that the inrush current remains constant for the entire turn-on period. Such a behavior naturally leads to an improved tradeoff between the inrush current and the turn-on-time. In addition, in such a case the turn-on waveform is nearly independent of any resistive load $R_L$ (reference numeral 112) at the output.

In the example circuit arrangement of FIG. 1b only one switch 100 is necessary to control the inrush current. I.e. there is no need to apply a two-step approach using parallel switches in order to control the inrush current. This simplifies the control and testing of the arrangement and it reduces the pin count in case that the switch 100 is an external transistor switch, i.e. a switch external to the power management chip, e.g. implemented on the PCB (printed circuit board).

The switch driver 120 for the high-side NMOS switch 100 comprises a push-pull stage 130 which comprises the transistors P1 and N1 and which is supplied by a charge pump 121. The charge pump 121 may fulfill two functions in the circuit arrangement 120 of FIG. 1b. First, the charge pump 121 provides a voltage level, which ensures that the NMOS switch 100, is activated when applied to the gate terminal 102. Second, the charge pump 121 provides a current $I_{CP}$, which is used to control the slew rate of the voltage at the output terminal 103 of the NMOS switch 100.

It should be noted that in the following a transistor, which is referenced by a "P", indicates a p-type transistor, e.g. a PMOS transistor, whereas a transistor, which is referenced by an "N", indicates an n-type transistor, e.g. an NMOS transistor. In the illustrated example, P1 is a PMOS transistor, whereas N1 is an NMOS transistor.

In FIG. 1b when the switch 100 is to be enabled (i.e. closed or activated), the transistor P1 is turned on, while the transistor N1 is turned off. The turning on/off of the transistors P1/N1 is typically controlled using a control signal, which is applied to the gate terminals of the transistors P1/N1. By turning on P1 and turning off N1, the control terminal 102 of the switch 100 is linked or coupled to the charge pump 121, thereby pulling the gate voltage up, i.e. thereby providing the gate bias for enabling the switch 100. On the other hand, if the switch is to be disabled (i.e. opened or de-activated), N1 is turned on and P1 is turned off. By doing this, the control terminal 102 is coupled to the negative or low voltage rail 111, thereby pushing the gate voltage down, i.e. thereby removing the gate bias.

In order to provide a slew-rate limiter to the switch 100, a capacitive feedback may be added to sample the instantaneous output voltage at the output terminal 103. In the illustrated example, the capacitive feedback comprises a capacitor 122 and a current mirror 140. The current through the capacitor C (reference numeral 122) is proportional to the voltage slew-rate at the "OUT" terminal 103 of the switch 100, if the other terminal of the capacitor 122 is held at a constant voltage. This is because $$I_C = C \frac{dV_{OUT}}{dt},$$

wherein $I_C$ is the current through the capacitor 122 and wherein $V_{OUT}$ is the output voltage at the output terminal 103.

This equation may be applied to the switch driver arrangement shown in FIG. 1b. In particular, it can be seen that if the push-pull stage 130 is set to provide the gate bias to the NMOS switch 100, the absolute value of the current through the transistor N2 of the current mirror 140 corresponds to the absolute value of $I_{CP}$, i.e. to the absolute value of the short circuit current of the charge pump 121. Due to the characteristics of the current mirror 140, $I_{CP}$ is proportional to $I_C$ passing through the transistor N3 of the current mirror 140. The proportionality or gain factor between the current flowing through N3 and the current flowing though N2 may be defined as the mirror ratio k. The mirror ratio k typically depends on the technology associated with the transistors N2 and N3 and/or on the width to length ratio of the transistors N2 and N3. In an embodiment, the N2/N3 mirror ratio is $$k = \frac{W_{N2}}{L_{N2}} \frac{L_{N3}}{W_{N3}},$$

wherein $$\frac{W_{N3}}{L_{N3}}$$

is the width to length ratio of N3 and $$\frac{W_{N2}}{L_{N2}}$$

is the width to length ratio of N2. In view of the above, the voltage slew rate at the "OUT" terminal 103 of the switch 100 is given by:

$$\frac{dV_{OUT}}{dt} = \frac{I_C}{C} = \frac{I_{CP}}{kC} = I_{CP} \frac{1}{C} \frac{W_{N3}}{L_{N3}} \frac{L_{N2}}{W_{N3}}. \quad (1)$$

Consequently, the output gate voltage of the switch N0 is restrained via the capacitive feedback loop or feedback control link and rises in such a way that the current through the capacitor C is proportional to the short circuit current of the charge pump $I_{CP}$. In particular, the slew rate of the output gate voltage of the switch 100 corresponds to the short circuit current of the charge pump $I_{CP}$ multiplied by the inverse capacitor value C and the inverse N2/N3 mirror ratio k.

It should be noted that the current mirror 140 of the capacitive feedback is optional and has a main function of amplifying the current through the capacitor $I_c$ by the gain factor k. As a consequence, the capacitor value C may be reduced while achieving a slew rate limitation, which is proportional to $$\frac{1}{kC}.$$

Figure 1C:
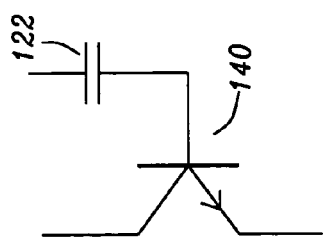
FIG. 1c illustrates example bipolar and CMOS amplifiers.
Figure 1C:
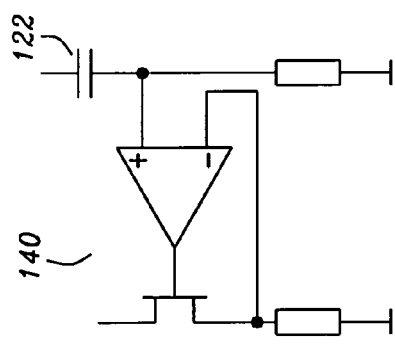

Alternatively or in amnion, a capacitor with a value of kC may be used. Alternatively or in addition, other current amplification means than a current mirror 140 could be used in the capacitive feedback loop or feedback control link. Examples are bipolar or CMOS amplifiers as illustrated in FIG. 1c. Furthermore, it should be noted that in an alternative embodiment, the drain terminal of transistor N2 of the current mirror 140 may be connected to the source terminal of transistor P1 of the push-pull stage 130 as shown e.g. in FIG. 2. In this case, the point where the feedback loop is closed (i.e. where the current provisioning means are connected to the feedback control link) is different from the point where the NMOS switch is controlled (i.e. where the gate is connected to the push pull control stage). Both nodes in the circuit arrangement are, however, connected via the transistor P12 that is closed when the NMOS switch is activated.

Figure 2:
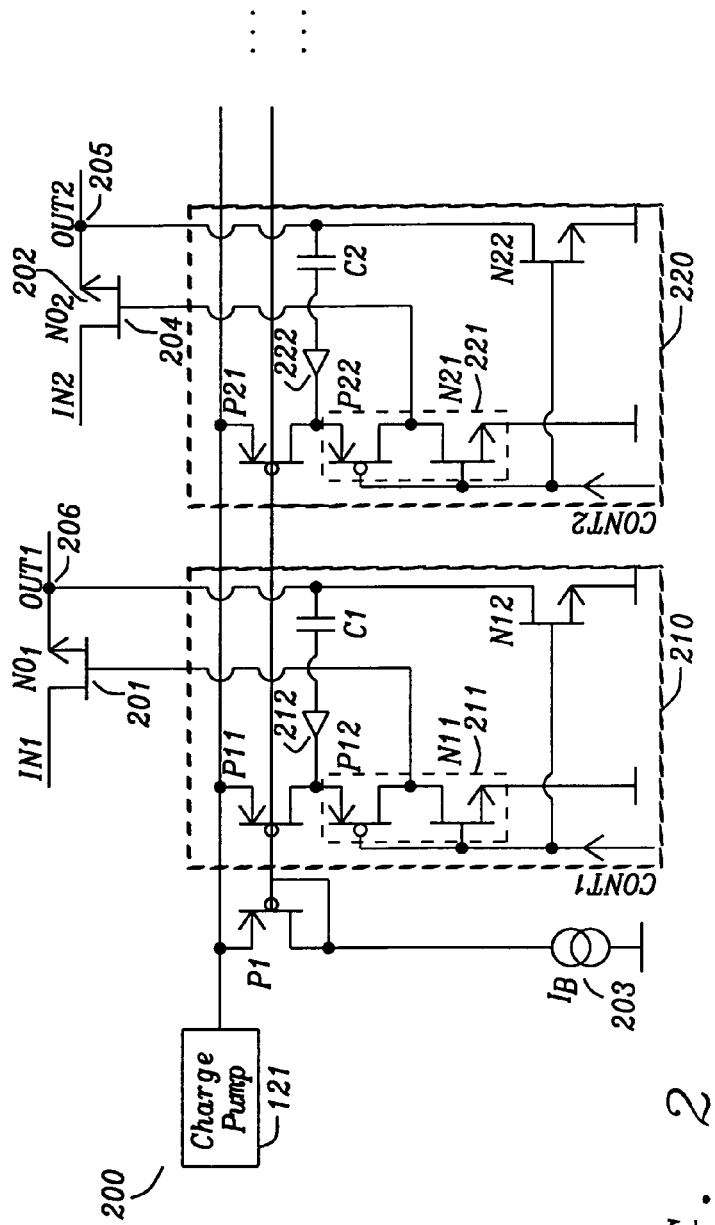
FIG. 2 shows an example array of slew-rate limited switch drivers.

FIG. 2 illustrates an example array of slew-rate limited switch drivers 200. For this purpose, the driver arrangement 120 of FIG. 1b is extended by further current provisioning means. It can be seen from equation (1) for the single switch arrangement that the slew-rate of the output voltage of the NMOS switch 100, i.e.

$$\frac{dV_{OUT}}{dt},$$

is proportional to the short circuit current of the charge pump 121, i.e. $I_{CP}$. In case of a plurality of driver cells 120, the current $I_{CP}$, as supplied by the charge pump 121 in an arrangement like FIG. 1, would have to be shared between the individual switch driver cells. The slew-rate of the output voltage of an NMOS switch 100, i.e.

$$\frac{dV_{OUT}}{dt},$$

would therefore be dependent on the number of switches 100 being turned on simultaneously.

One possibility to circumvent this problem could be to use one individual charge pump 121 for each switch 100. The use of a plurality of charge pumps 121 is, however, not desirable for several reasons, in particular for cost and/or layout reasons. Therefore, the example setup 200 of FIG. 2 is proposed which makes use of a single charge pump 121 for driving an array of NMOS switches $N0_1$ and $N0_2$ (reference numerals 201 and 202, respectively). It should be noted that the illustrated arrangement might be used for any number of NMOS switches 201, 202.

FIG. 2 shows switch drivers 210, 220 for NMOS switches 201, 202, respectively. Each of these switch drivers 210, 220 corresponds to a switch driver 120 as shown in FIG. 1b. The switch drivers 210, 220 comprise a push-pull stage 211, 221 (respectively) made up of transistors P12, N11 and P22, N21, respectively. Furthermore, each of the switch drivers 210, 220 comprises a capacitive feedback loop or feedback control link, which comprises a capacitor C1, C2 (respectively) and current amplification means 212, 222 (respectively). It should be noted that in the illustrated example, the feedback loop or feedback control link is connected to the source terminal of transistor P12, P22 which is an alternative implementation to the connection to the drain terminal of transistor P12, P22 as illustrated in FIG. 1b. In an alternative embodiment, the feedback control link is directly connected to the gate of the NMOS switch as in FIG. 1b.

In addition, the driver arrangements 210, 220 comprise optional pull-down transistors N12, N22 (respectively) which are controlled in sync with the push-pull stage 211, 221 and which are used to pull down the voltage at the output terminals 206, 205 of the NMOS switches 201, 202 when in an off-state. Furthermore, reference numeral 204 indicates the gate terminal of NMOS switch 202. In order to isolate the charge pump 121 from the switch drivers 210, 220 an additional current source 203 is provided. In the illustrated example, only one additional current source 203 is used as current reference for the array of drivers 210, 220. In alternative embodiments, a dedicated current source 203 may be used for each individual switch driver 210, 220. In other words, the voltage provisioning function and the current provisioning function of the charge pump 121 are de-coupled. As such, the charge pump 121 of FIG. 2 is mainly used for providing a bias gate voltage to ensure the reliable switching of each switch 201, 202 of the array of NMOS switches 201, 202. Furthermore, one or more current sources 203 are used to provide an essentially constant current $I_B$ to the array of switch drivers 210, 220 in order to control the slew rate of the output voltage of each NMOS switches 201, 202 of the array of NMOS switches. Please note that the actual total current that is supplied to the plurality of connections with the feedback control link in the NMOS switch array is provided by the charge pump while the current source 203 serves primarily as a current reference for controlling the slew rate.

The current $I_B$ of the current source 203 mathematically replaces the current $I_{CP}$ in equation (1) and thereby decouples the slew-rate of the output voltage of each NMOS switch 201, 202, i.e.

$$\frac{dV_{OUT1}}{dt}$$

and $$\frac{dV_{OUT2}}{dt},$$

respectively, of any activity in the respective other switch drivers 210, 220.

This can be seen in FIG. 2, where the first driver 210 of the first NMOS switch 201 comprises the push-pull stage 211 and the capacitive feedback loop or feedback control link comprising the capacitor C1 and the current amplification means 212. It can be seen that if the NMOS switch 201 is coupled to the charge pump 121 using the push-pull stage 211, the current through the capacitor C1 is mirrored to the current $I_B$ of the current source 203 using the current mirror defined by transistors P1 and P11. The slew-rate of the output voltage of switch 201 is therefore given by $$\frac{dV_{OUT1}}{dt} = \frac{I_{C1}}{C1} = \frac{k_{12}}{k_{11}C1}I_B,$$

wherein $k_{11}$ is the current gain of the feedback amplification means 212 and $k_{12}$ is the gain factor of the current amplification means, i.e. the mirror ratio of the current mirror defined by transistors P1 and P11. It should be noted that the current mirror defined by transistors P1 and P11 is optional and/or may be replaced by any kind of current amplification means with a current gain factor $k_{12}$.

In a similar manner, the second driver 220 comprises the second push-pull stage 221 and the capacitive feedback loop or feedback control link is defined by capacitor C2 and current amplification means 222. The slew-rate of the output voltage of switch 202 is given by $$\frac{dV_{OUT2}}{dt} = \frac{I_{C2}}{C2} = \frac{k_{22}}{k_{21}C2}I_B,$$

wherein $k_{21}$ is the gain value of the feedback amplification means 222 and $k_{22}$ is the gain factor of the current amplification means, i.e. the mirror ratio of the current mirror defined by transistors P1 and P21. In a similar manner to the first driver 210, the latter current mirror may be implemented as any kind of current amplification means with a gain value $k_{22}$.

Overall, FIG. 2 discloses a circuit arrangement configured for controlling an array of NMOS switches 201, 202. By providing separate voltage provisioning means 121 and one or more current provisioning means 203, slew rate limited switch drivers 210, 220 for an array of NMOS switches 201, 202 can be provided.

Figure 3:
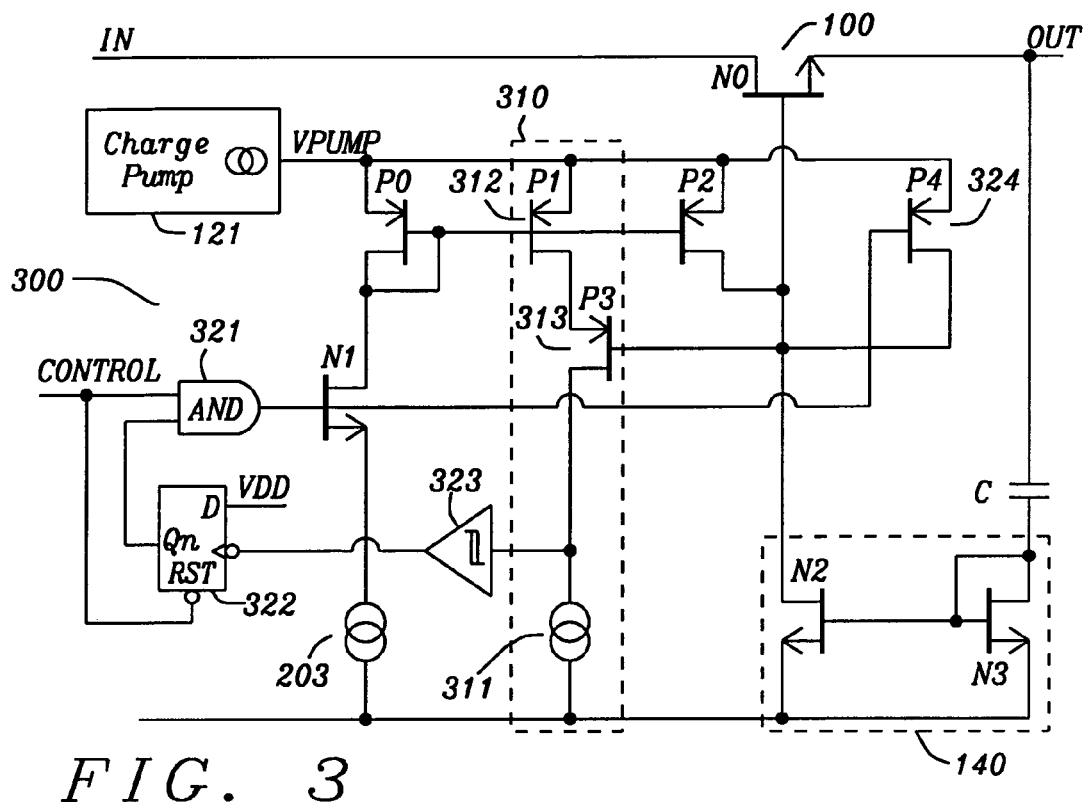
FIG. 3 shows an example array of slew-rate limited switch drivers with zero current draw of the charge pump in steady state.

FIG. 3 illustrates an example slew-rate limited switch driver 300 with zero current draw from the charge pump 121 when in steady state. The illustrated arrangement 300 may be beneficial to reduce the current draw from the charge pump 121 of a driver arrangement similar to FIG. 2. Even though the driver arrangement of FIG. 2 comprises a current source 203, the basic circuit in FIG. 2 still has a side effect inasmuch as the branch given by the current source 203 and the transistor P1 may cause a current draw from the charge pump 121, even when all switches 201, 202 are in steady state, in particular in the on-state. This current can be eliminated e.g. by the extension depicted in FIG. 3.

In a similar manner to FIG. 2, the current $I_B$ of the current source 203 is used in the arrangement of FIG. 3 to control or limit the current through the capacitor C using a current mirror P0, P2 that corresponds to the current mirror P1, P11 of FIG. 2. In the circuit arrangement 300 of FIG. 3, the current $I_B$ through the current mirror P0, P2 is controlled, however, using an additional switch N1. In the arrangement of FIG. 3, the switch N1 takes on the role of the push-pull stage 140, 211 of FIGS. 1b, 2. When the NMOS switch N0 100 is to be enabled, the transistor N1 is turned on using an appropriate control signal being applied at the AND gate 321. The circuit 300 then operates as previously described in the context of FIG. 2.

However, the circuit arrangement 300 of FIG. 3 comprises an additional comparing unit 310 which comprises the transistors P1 (reference numeral 312) and P3 (reference numeral 313) and the associated bias current source or sink 311. The components of the comparing unit 310 are arranged to form a comparator for sampling the gate voltage of the NMOS switch N0 100. If the gate voltage of the switch N0 has reached a certain level below the voltage VPUMP provided by the charge pump 121, the circuit 300 ceases to operate in a slew-rate limiting mode and the transistor P4 (reference numeral 324) switches the voltage VPUMP to the gate of NMOS switch N0 to thereby turn the switch N0 fully on. At the same time the transistor N1 is turned off, thereby reducing to zero all currents drawn from the charge pump 121 for that switch driver cell.

In addition, the circuit arrangement 300 may comprise a Schmitt trigger 323 in order to prevent instabilities or oscillations that may occur due to the switch over from the slew-rate limited mode to the full charge mode. Furthermore, a D-Flip-Flop 322 may be added to latch the full charge mode until the control signal goes low and then high again.

In other words, FIG. 3 adds an additional functionality of current draw limitation or current draw removal from the charge pump 121 in steady state operations. This additional functionality is provided by a comparing unit 310, which monitors the voltage at the gate of the NMOS switch N0. If the voltage at the gate of the NMOS switch N0 has reached the voltage of the charge pump 121 minus a threshold value, the circuit is switched from a slew rate limitation mode to a full voltage mode by disabling the capacitive feedback and by providing the voltage of the charge pump 121 to the gate of the NMOS switch N0. As a result, no current is drawn from the charge pump 121 during on-state.

Figure 4:
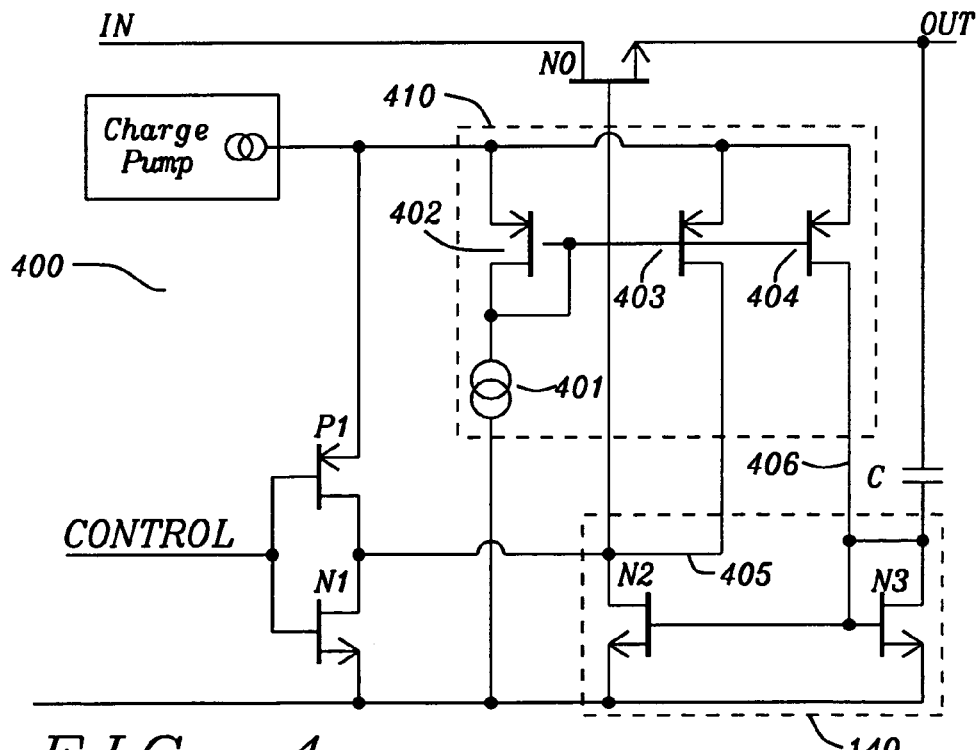
FIG. 4 illustrates another example slew-rate limited switch driver.

FIG. 4 shows another embodiment of a slew-rate limiter cell or a slew rate limited switch driver 400. A slew-rate limiter that follows the principles described in this document can take on many forms. The basic cell depicted in FIG. 1 may e.g. have a side effect caused by the threshold voltage $V_T$, i.e. the threshold gate source voltage, of the current mirror transistors N2 and/or N3. This side effect will typically impede any current flow into transistor N3 until $V_{OUT}$ has reached the level of the threshold voltage $V_T$ of the transistor N3. In this situation, i.e. in the situation $V_{OUT} < V_T$, the capacitive feedback loop is open and no slew-rate limiting happens.

The circuit 400 illustrated in FIG. 4 may overcome this side effect by using a pre-biasing scheme for the transistors N2/N3 of the current mirror 140 of the capacitive feedback loop or feedback control link. For such a pre-biasing scheme, a constant current is fed in transistors N2/N3 to keep the current mirror 140 in on-state, even at low output voltages. Typically, the bias currents $I_{N2}$ (reference numeral 405) and $I_{N3}$ (reference numeral 406) should have the same ratio as the mirror ratio k of the current mirror comprising transistors N2 and N3. As such, $I_{N2} = k \cdot I_{N3}$ if the width to length ratio of the output transistor N2 and the width to length ratio of the input transistor N3 relate by the mirror ratio k, i.e.

$$\frac{W_{N2}}{L_{N2}} = k \frac{W_{N3}}{L_{N3}}.$$

In FIG. 4, the pre-bias current through the transistors N2 and N3 of the current mirror 140 is provided by the pre-biasing means. The pre-biasing means 410 may comprise a current source 401 which feeds a current mirror comprising transistors 402 and 403 to provide the pre-bias current $I_{N2}$ and which feeds a current mirror comprising transistors 402 and 404 to provide the pre-bias current $I_{N3}$. By selecting the appropriate dimensions of transistors 402, 403 and/or 404, it can be ensured that $I_{N2} = k \cdot I_{N3}$. It should be noted that the current mirrors of the pre-biasing means 410 might be implemented as current amplification means. Alternatively or in addition, separate current sources 401 may be used to provide the pre-bias current $I_{N2}$ and $I_{N3}$.

Due to the pre-biasing currents $I_{N2}$ and $I_{N3}$, it may be ensured that the transistors N2 and N3 are always biased at the voltage level of $V_T$. This eliminates the unwanted situation of an open regulation loop and thereby guarantees a slew-rate limited turn-on behavior of the switch N0.

Figure 5:
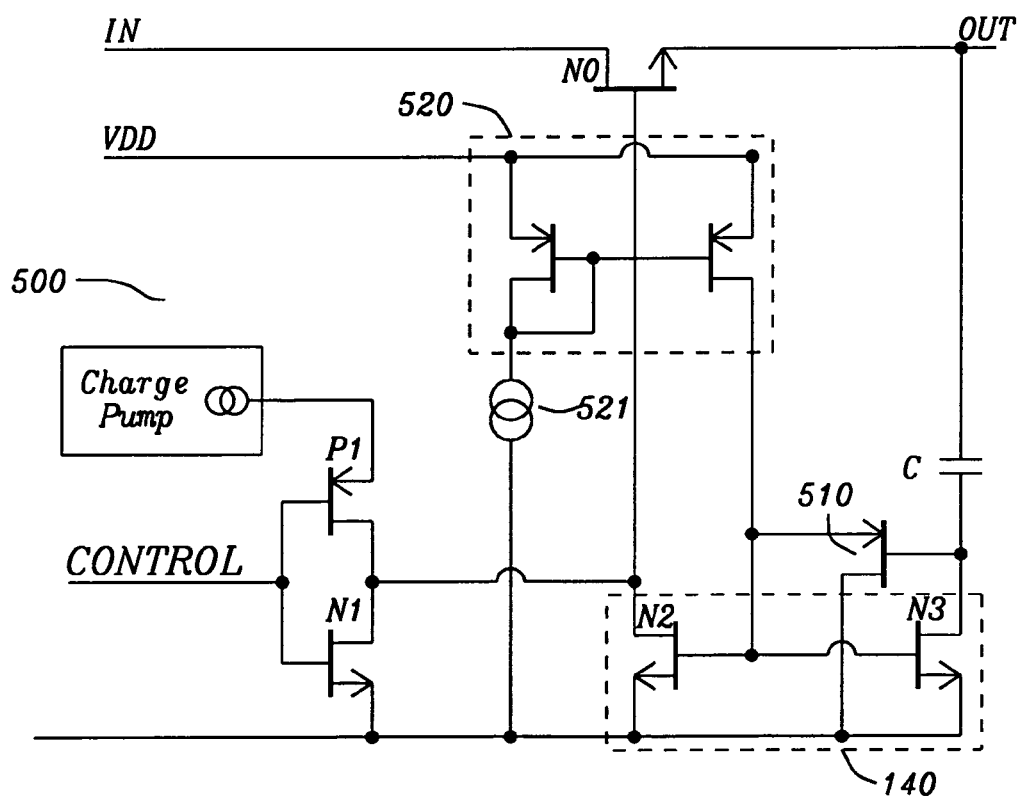
FIG. 5 illustrates a further example slew-rate limited switch driver.

The circuit in FIG. 5 presents an embodiment of a slew-rate limiter cell 500 comprising a solution to reduce the side effect of no slew-rate limiting at low output voltages, i.e. notably output voltages below the threshold voltage of the transistors N2 and/or N3 of the current mirror 140. In this embodiment, a source follower is added into the gate terminal of transistors N2 and to decrease the effective threshold voltage of the current mirror 140 to $V_{Teff} = V_{Tn} - V_{Tp}$, wherein $V_{Tn}$ is the threshold voltage of the switches N2 and N3 (e.g. NMOS switches) and $V_{Tp}$ is the threshold voltage of the transistor of the source follower (e.g. a PMOS switch). The source follower 510 may be coupled to the positive supply voltage $V_{DD}$ via a current mirror 520 being fed by a current source 521.

The effective threshold voltage may be controlled by selecting the transistors N2 and/or N3 with threshold voltage $V_{Tn}$ and a transistor of the source follower with threshold voltage $V_{Tp}$. For a standard CMOS mixed mode process, the effective threshold voltage $V_{Teff}$, while the capacitive feedback loop is open and no slew-rate limiting will happen, can be reduced from 0.75V to 0.35V by using the circuit arrangement 500 illustrated in FIG. 5.

In FIGS. 1b, 2 to 5 several embodiments of driver arrangements for one or more NMOS switches have been described. It should be noted that these embodiments could be combined with one another. In particular, the driver arrangements shown in the context of one NMOS switch may be scaled and applied to the control of an array of NMOS switches. In a similar manner, the pre-biasing scheme and the source follower scheme may be applied to the driver circuits of an array of NMOS switches. Furthermore, it should be noted that when combining the different embodiments certain components, notable the different current sources 203, 401, 521, might be combined, e.g. implemented as a joint current source.

In the present document, various methods and arrangements for driving one or more NMOS switches, e.g. NMOS power switches, have been described. Using these methods and/or circuit arrangements it is possible to limit the number of charge pumps to only one charge pump which supplies power to an array of NMOS switch drivers, in particular an array of slew-rate limited switch drivers. Enhanced switch driver arrays with zero current draw in steady state have been described. As a result of using only one charge-pump the required power consumption, layout area and test time can be reduced. Furthermore, if external components are required, the overall pin count can be reduced. The use of slew-rate limited switches reduces the inrush current and improves system robustness. Overall, the described methods and systems enable the use of NMOS switches in a less costly way. In particular, the method and systems outlined in the present document enable the use of NMOS switches which typically leads to a layout area benefit because of the improved $R_{DSon}$—to—area ratio of NMOS switches compared to PMOS switches.

Figure 6:
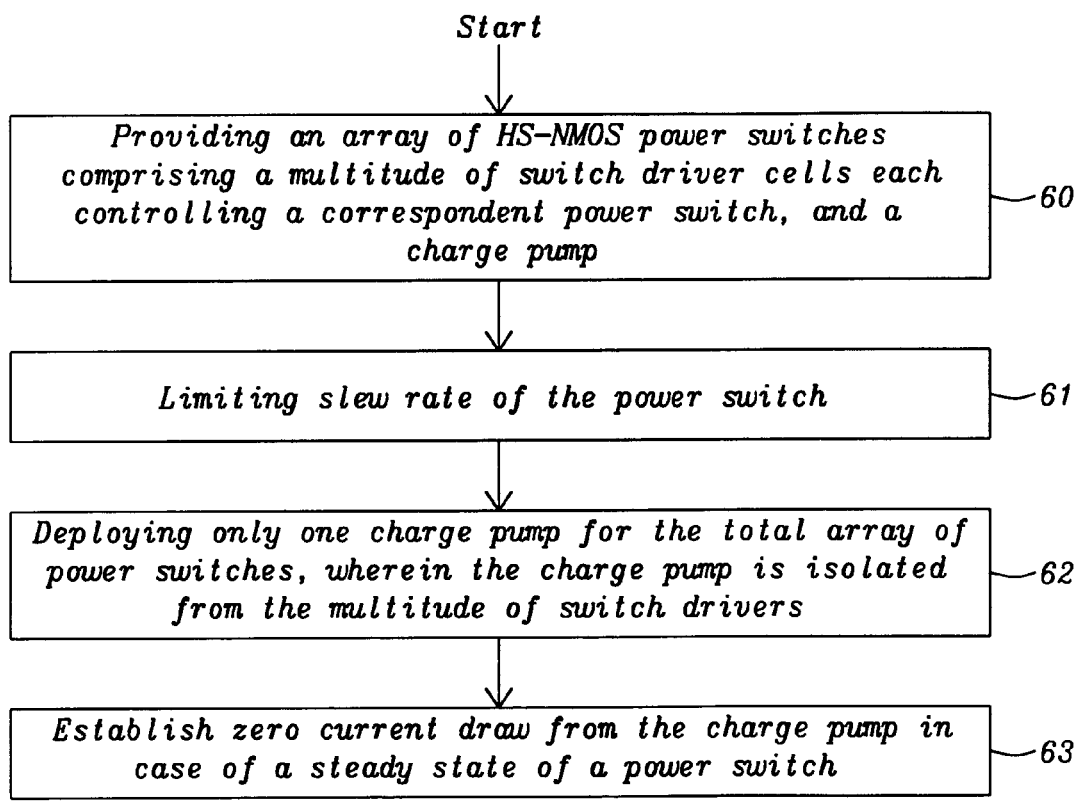
FIG. 6 illustrates a flowchart of a method invented for controlling an array of power switches with slew-rate limit.

FIG. 6 illustrates a flowchart of a method invented for controlling an array of power switches with slew-rate limit.

Step 60 of the method of FIG. 6 illustrates the provision of an array of HS-NMOS power switches comprising a multitude of switch driver cells each controlling a correspondent power switch. Step 61 illustrates limiting slew rate of the power switch. Step 62 describes deploying only one charge pump for the total array of power switches, wherein the charge pump is isolated from the multitude of switch drivers, and finally, step 63 illustrates establishing zero current draw from the charge pump in case of a steady state of a power switch.

It should be noted that the description and drawings merely illustrate the principles of the proposed methods, and systems. It will thus be appreciated that those skilled in the art will be able to devise various arrangements that, although not explicitly described or shown herein, embody the principles of the proposed methods and systems and are considered to be part of the disclosure of this document. Furthermore, all statements herein reciting principles, aspects, and embodiments of the proposed methods and systems, as well as specific examples thereof, are intended to encompass equivalents thereof.

While the invention has been particularly shown and described with reference to the preferred embodiments thereof, it will be understood by those skilled in the art that various changes in form and details may be made without departing from the spirit and scope of the invention.

What is claimed is:

1. A circuit arrangement configured to control a first NMOS switch, the arrangement comprising:
   voltage provisioning means configured to supply a gate voltage to a gate terminal of the first NMOS switch;
   current provisioning means configured to provide a current;
   a first control stage configured to provide and/or remove a connection between the gate terminal of the first NMOS switch and the voltage provisioning means, thereby switching the first NMOS switch to an on-state and/or an off-state, respectively; and
   a first feedback control link coupling an output terminal of the first NMOS switch with the current provisioning means, wherein the current provisioning means are configured to control the slew-rate of a voltage at the output terminal using the current provided by the current provisioning means; wherein the current provided by the current provisioning means or an amplified version thereof is equal to a current at the output of the first feedback control link.

2. The circuit arrangement of claim 1 wherein the first feedback control link comprises a first capacitor C1.

3. The circuit arrangement of claim 2, wherein the first feedback control link further comprises first feedback amplification means configured to map a current through the first capacitor C1 at an input of the first feedback amplification means to a current at an output of the first feedback amplification means coupled to the current provisioning means.

4. The circuit arrangement of claim 3, wherein
   the current at the output of the first feedback amplification means is proportional to the current provided by the current provisioning means;
   the slew rate of the output voltage $$\frac{dV_{OUT}}{dt} = \frac{I_{C1}}{C1} = \frac{I_{CP}}{k_1 C1};$$

$I_{C1}$ is the current through the first capacitor C1;
$I_{CP}$ is proportional to the current provided by the current provisioning means; and
$k_1$ is a gain value of the first feedback amplification means.

5. The circuit arrangement of claim 4, wherein
   the first feedback amplification means is a first current mirror;
   the first current mirror comprises an input transistor and an output transistor; and
   the gain value $$k_1 = \frac{W_{N2}}{L_{N2}} \frac{L_{N3}}{W_{N3}},$$

with $$\frac{W_{N2}}{L_{N2}}$$

being a width to length ratio of the output transistor (N2) and $$\frac{W_{N3}}{L_{N3}}$$

being a width to length ratio of the input transistor.

6. The circuit arrangement of claim 5, further comprising current biasing means configured to provide bias currents to the input transistor and the output transistor of the first current mirror.

7. The circuit arrangement of claim 6, wherein the current biasing means comprise
   first bias amplification means configured to amplify the current of a biasing current source and to provide the current amplified by the first bias amplification means to the input transistor of the first current mirror; and
   second bias amplification means configured to amplify the current of the biasing current source and to provide the current amplified by the second bias amplification means to the output transistor of the first current mirror.

8. The circuit arrangement of claim 7, wherein the ratio of the current amplified by the second bias amplification means and the current amplified by the first bias amplification means corresponds to the gain value $k_1$.

9. The circuit arrangement of claim 5, further comprising a source follower, wherein an output terminal of the source follower is connected to a common gate terminal of the input transistor and the output transistor of the first current mirror.

10. The circuit arrangement of claim 9, further comprising a current source for the source follower, wherein the current source for the source follower (510) provides a current to a source terminal of the source follower.

11. The circuit arrangement of claim 1, wherein the first control stage comprises
    a pull transistor configured to couple the gate terminal of the first NMOS switch to the voltage provisioning means when the pull transistor is switched on; and
    a push transistor configured to couple the gate terminal of the first NMOS switch to a low voltage point when the push transistor is switched on.

12. The circuit arrangement of claim 1, configured to control a second NMOS switch, further comprising:
    a second control stage configured to provide and/or remove a connection between a gate terminal of the second NMOS switch and the voltage provisioning means, thereby switching the second NMOS switch to an on-state and/or an off-state, respectively; and a second feedback control link between an output terminal of the second NMOS switch and the current provisioning means configured to control the slew-rate of a voltage at the output terminal of the second NMOS switch.

13. The circuit arrangement of claim 1, further comprising current amplification means configured to amplify the current provided by the current provisioning means and to provide the current amplified by current amplification means to the first feedback control link.

14. The circuit arrangement of claim 13, wherein the current amplification means corresponds to a current mirror.

15. The circuit arrangement of claim 1 wherein the voltage provisioning means and the current provisioning means are implemented as a common charge pump and wherein the first feedback control link is coupled to the gate terminal.

16. The circuit arrangement of claim 1, further comprising
a comparing portion configured to monitor the voltage at the gate terminal of the first NMOS switch and configured to detect that the voltage at the gate terminal of the first NMOS switch exceeds a voltage threshold value; and
a mode switching portion configured to disconnect the current provisioning means from the first feedback control link and configured to provide a connection between the gate terminal of the first NMOS switch and the voltage provisioning means, if the voltage at the gate terminal of the first NMOS switch exceeds the voltage threshold value.

17. The circuit arrangement of claim 16, wherein the comparing portion comprises one or more transistors and a current sink.

18. The circuit arrangement of any of claim 16, wherein the mode switching portion comprises a transistor P4 configured to provide the connection between the gate terminal of the first NMOS switch and the voltage provisioning means.

19. The circuit arrangement of claim 16, wherein the mode switching portion comprises at least one of a Schmitt trigger, a D-Flip-Flop and an AND gate.

20. The circuit arrangement of claim 1, wherein the NMOS switch is a high side NMOS power switch.

* * * * *